United States Patent
Wu

(10) Patent No.: US 7,352,056 B2
(45) Date of Patent: Apr. 1, 2008

(54) SEMICONDUCTOR PACKAGE STRUCTURE WITH MICROSTRIP ANTENNAN

(75) Inventor: Sung-Mao Wu, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 731 days.

(21) Appl. No.: 10/962,437

(22) Filed: Oct. 13, 2004

(65) Prior Publication Data

US 2006/0076658 A1    Apr. 13, 2006

(51) Int. Cl.
*H01L 21/425*    (2006.01)

(52) U.S. Cl. .................................. 257/678; 257/528

(58) Field of Classification Search .............. 257/723, 257/678, 538, 528
See application file for complete search history.

(56) References Cited

U.S. PATENT DOCUMENTS 5,202,752 A * 4/1993 Honjo ........................ 257/678
6,466,131 B1 * 10/2002 Tuttle et al. .............. 340/572.7

* cited by examiner

*Primary Examiner*—Roy Potter
(74) *Attorney, Agent, or Firm*—Bacon & Thomas, PLLC

(57) ABSTRACT

A semiconductor package structure with a microstrip antenna comprises a packaging substrate, a chip and a microstrip radiation device. The packaging substrate has an upper surface having a packaging area on which the chip is disposed and a peripheral area on which the microstrip radiation device is disposed for transceiving a signal of the chip.

16 Claims, 5 Drawing Sheets

SEMICONDUCTOR PACKAGE STRUCTURE WITH MICROSTRIP ANTENNAN

BACKGROUND OF THE INVENTION

1. Field of Invention

This invention relates to a semiconductor package. More particularly, the present invention is related to a semiconductor package with a microstrip antenna formed therein.

2. Related Art

A well-known wireless electronic application usually contains digital, analog and radio frequency devices and circuits and such circuit or devices are usually integrated in a chip. On the basis, such chip, antenna and passive components are then integrated in a printed circuit board. However, as mentioned above, only the passive components, digital, analog and radio frequency circuits are integrated in an assembly package accompanying the development of the semiconductor technologies, such as the improvements and the developments of multi-chips module package, chip scale package, wafer level packages and flip chip technology, but the antenna is formed in or disposed on printed circuits boards rather than integrated in an assembly package. The disadvantage is that it is not only to be able to integrate an antenna within a package module but also limit to the layout of another circuits in the printed circuit board.

Therefore, providing another semiconductor package with antenna devices formed therein to solve the mentioned-above disadvantages is the most important task in this invention.

SUMMARY OF THE INVENTION

In view of the above-mentioned problems, this invention is to provide a semiconductor package with microstrip antenna devices formed therein so as not to limit the layout of the circuits in a printed circuit board.

In view of the above-mentioned problems, this invention is to provide a semiconductor package with microstrip antenna devices formed therein so as to optimize the radiation power and the pattern field of the antenna.

In view of the above-mentioned problems, this invention is to provide a semiconductor package with microstrip antenna devices formed therein to optimize the protection and design of the electromagnetic radiation and electromagnetic compliance (EMC).

To achieve these and other advantages and in accordance with the purpose of the invention, as embodied and broadly described herein, the invention specifically provides a semiconductor package with a microstrip antenna formed therein. The package mainly comprises a packaging substrate, a chip and a microstrip radiation device. Therein, the packaging substrate has a packaging area and a peripheral area surrounding the packaging area; the microstrip radiation device is formed in the peripheral area and utilized for receiving and transmitting wireless signals of the chip.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
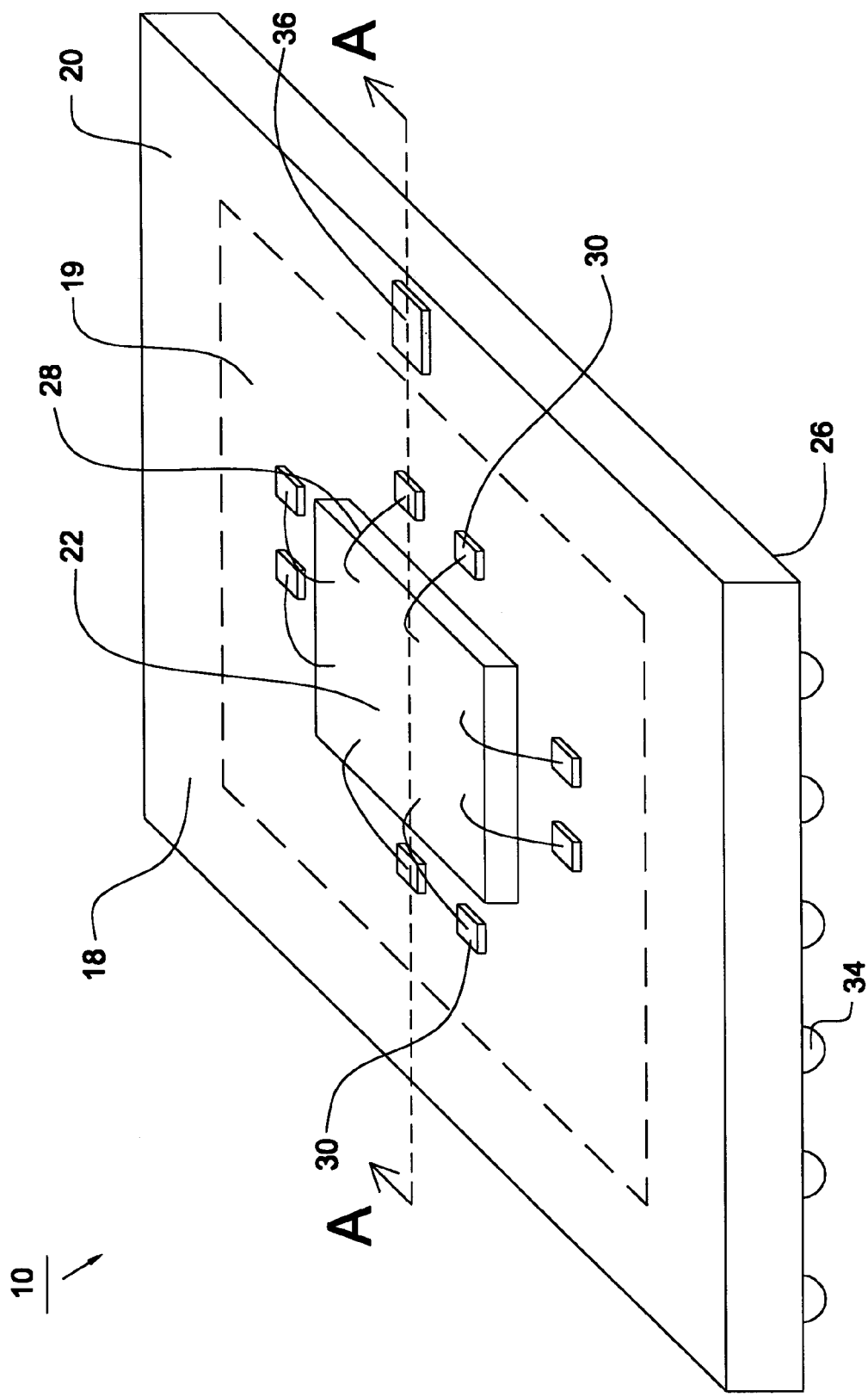
FIG. 1 is a three-dimensional diagram of a semiconductor package according to the preferred embodiment of the present invention.

The semiconductor package according to the preferred embodiments of this invention will be described herein below with reference to the accompanying drawings, wherein the same reference numbers are used in the drawings and the description to refer to the same or like parts.

Figure 2:
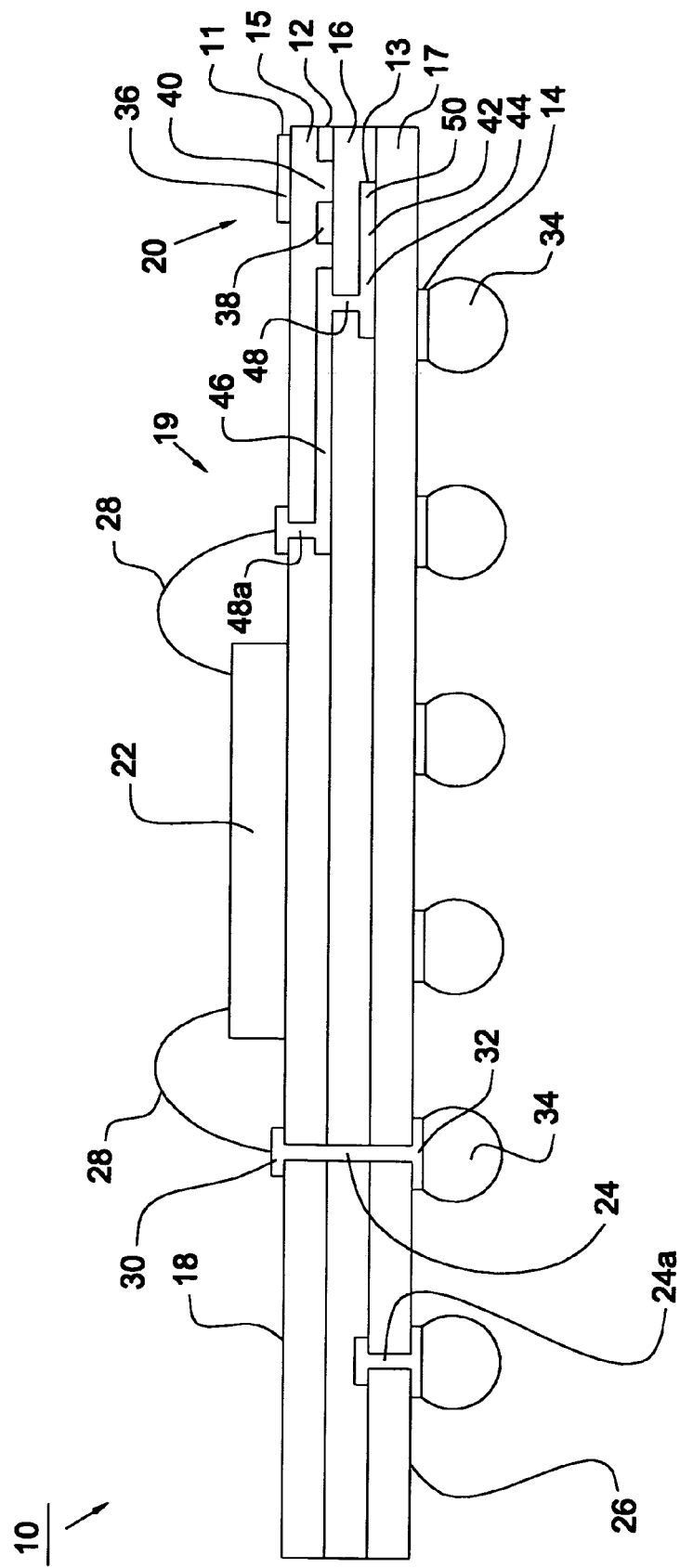
FIG. 2 is a cross-sectional view along the line A-A of FIG. 1.

As shown in FIGS. 1 and 2, it illustrates a first embodiment of this invention. The semiconductor package mainly comprises a carrier 10, such as a packaging substrate. The packaging substrate 10 has a first circuit layer 11, a second circuit layer 12, a third circuit layer 13 and a fourth circuit layer 14 from top to bottom. There is further a first dielectric layer 15 formed between the first circuit layer 11 and the second circuit layer 12; there are further a second dielectric layer 16 and a third dielectric layer 17 formed between the second circuit layer 12 and the third circuit layer 13, and the third circuit layer 13 and the fourth circuit layer 14 respectively.

As mentioned above, the packaging substrate 10 has an upper surface 18 which has a packaging area 19 and a peripheral area 20 surrounding the packaging area 19. Therein, the packaging area 19 has a chip 22 formed thereon and an encapsulation (not shown) is utilized to encapsulate the chip 22. As shown in FIG. 2, the packing substrate 10 has a plurality of through holes 24 formed therein for electrically connecting the upper surface 18 and the lower surface 26. To be noted, the upper surface 18 has a plurality of first contacts 30 formed thereon and the lower surface 26 has a plurality of second contacts 32 formed thereon; and the first contacts 30 and the second contacts 32 connect with each other via the though holes 24 and 24a and electrically conductive circuits. Besides, the second contacts 32 are electrically connected to a plurality of bumps 34 so as to have the chip 22 electrically connected to external devices (not shown).

Figure 3:
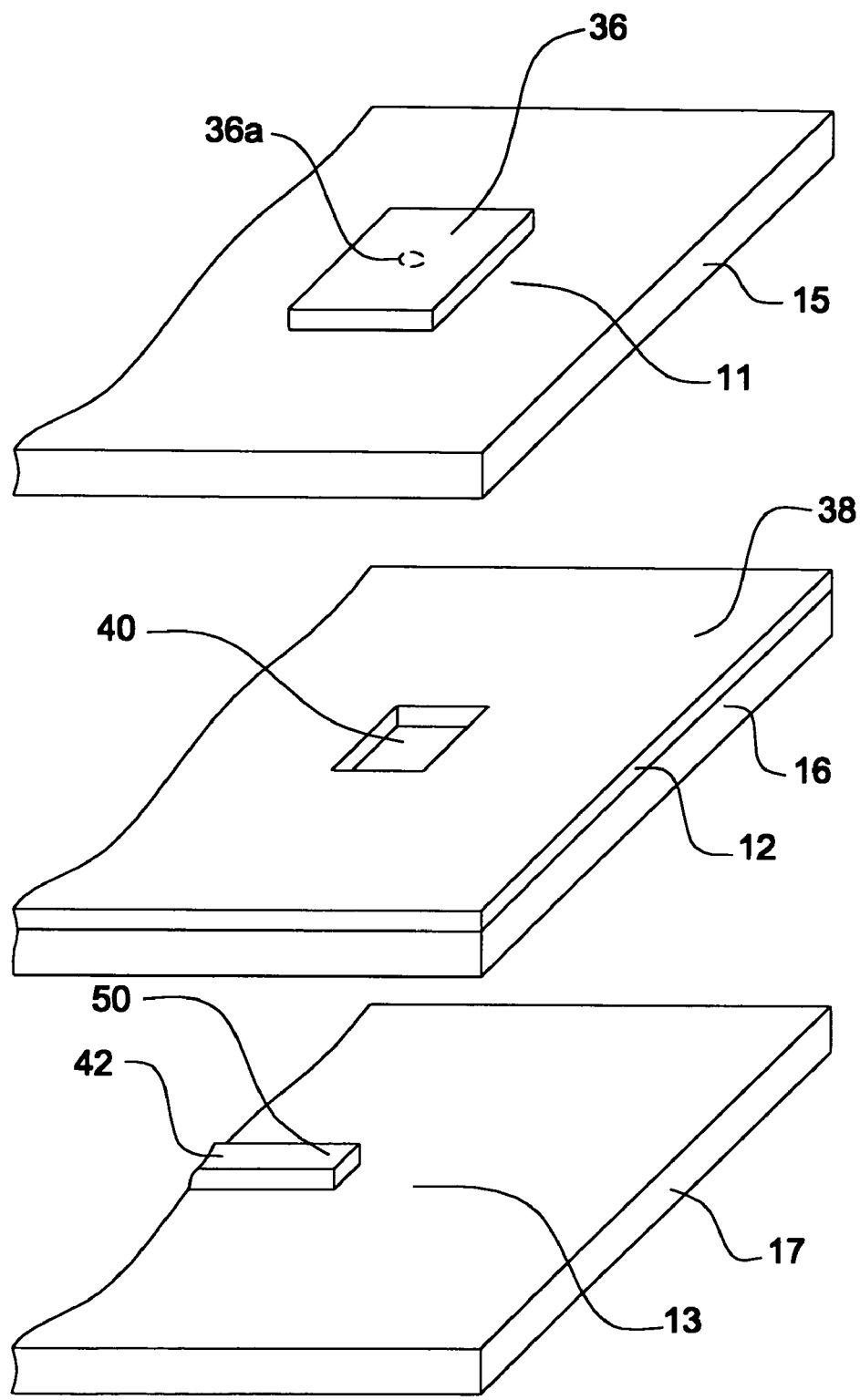
FIG. 3 is an explosive diagram of the peripheral area of FIG. 2.

Referring to FIGS. 2 and 3, which illustrates the explosive diagram showing a portion of the peripheral area 20. Therein, there is a microstrip radiation device 36 formed in the peripheral area 20 of the packaging substrate 10 wherein the microstrip radiation device 36 has a signal feed-in point 36a for receiving or transmitting (transceiving) a wireless signal. Furthermore, the second circuit layer 12 has a ground plane 38 located under the microstrip radiation device 36 and an opening 40 of the ground plane 38 corresponds the feed-in point 36a and is utilized to have the wireless signal passed through. In addition, the third circuit layer 13 has a signal feed-in line 42 for transmitting the wireless signal of the chip 22 and the signal feed-in line 42 is electrically connected to the chip 22 through a signal transmitting line 46, a though hole 48a and bonding wire 28. Moreover, the third circuit layer 13 is coupled to the microstrip radiation device 36 through the opening 40 of the ground plane 38.

To be noted and comprehensible, the shapes of the opening 40 or the microstrip radiation device 36 in this embodiment can be easily modified to be applicable to different types upon the working frequency, the match of the impedance of the anneta.

Figure 4:
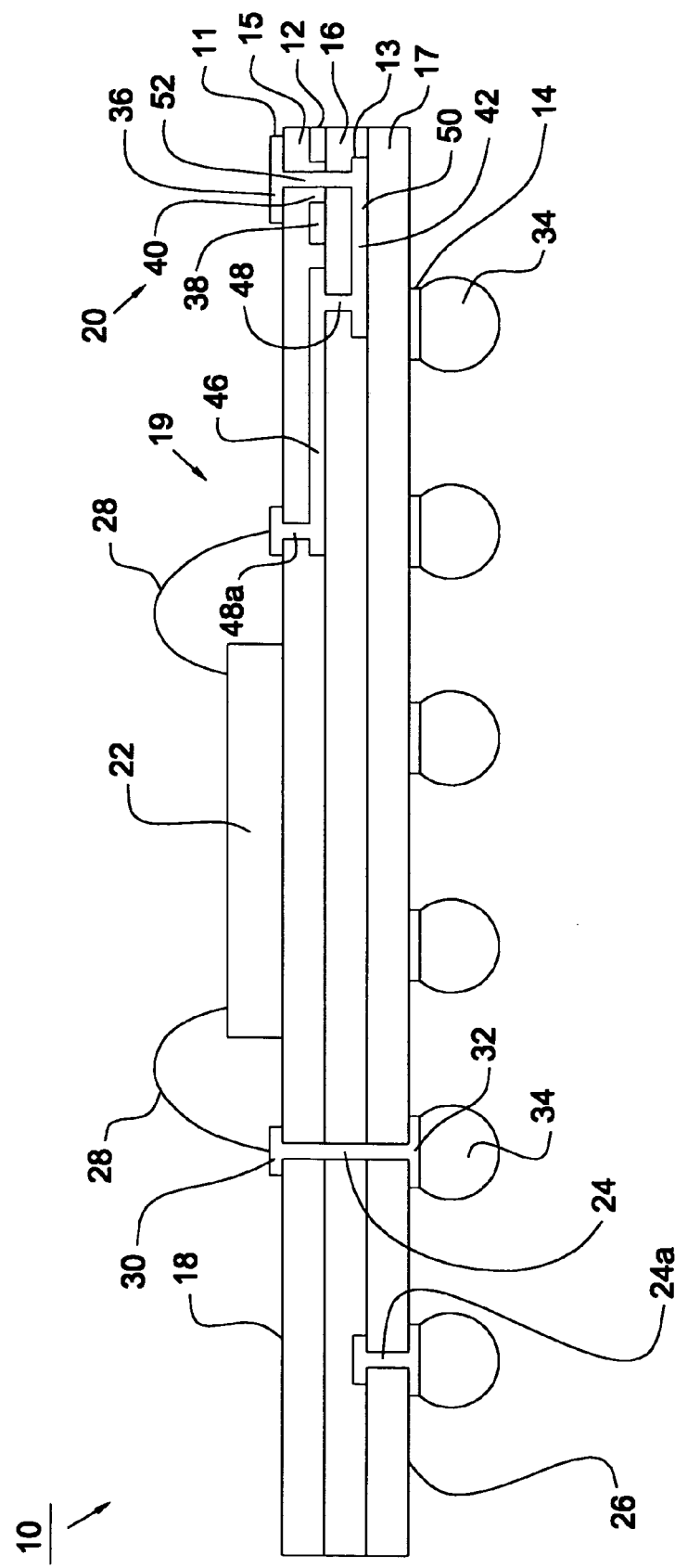
FIG. 4 is a cross-sectional view of a semiconductor package according to another preferred embodiment of the present invention.

In addition, the third circuit layer 13 is able to be electrically connected to the signal feed-in point 36a of the microstrip radiation device 36 via a through hole 52 passing through the opening 40 of the ground plane 38 as shown in FIG. 4.

Figure 5:
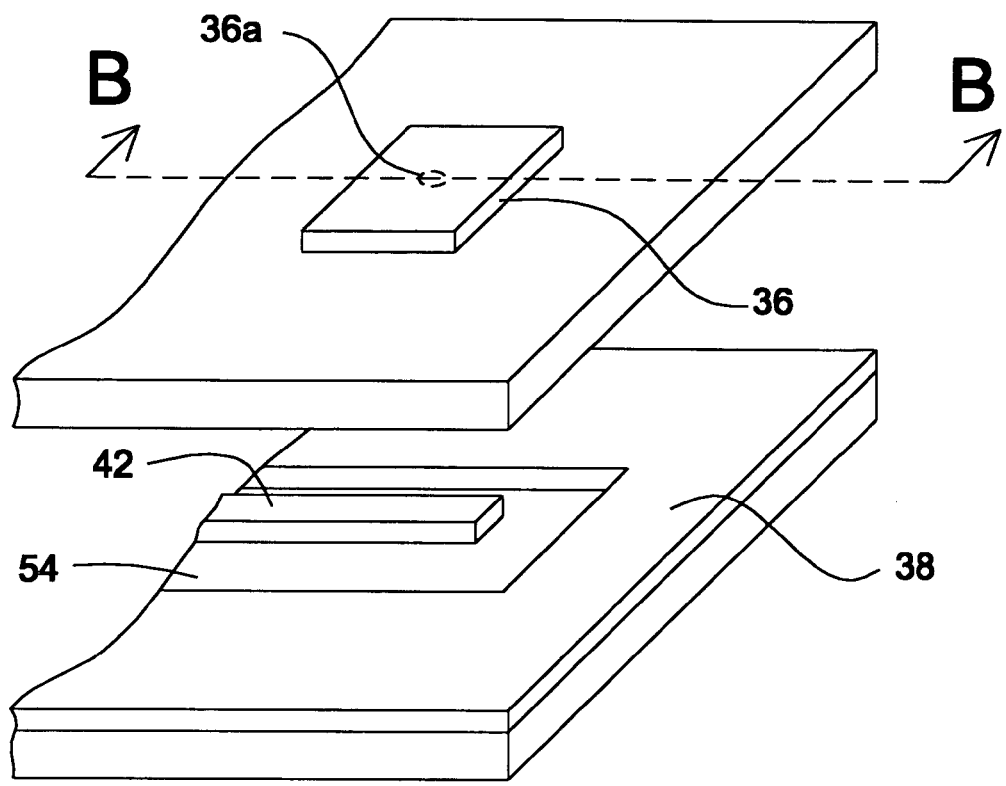
FIG. 5 is an explosive diagram of a circuit layer having a signal feed-in line and a ground plane.
Figure 6:
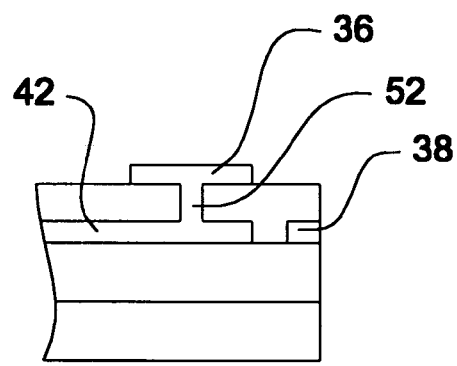
FIG. 6 is a cross-sectional view along the line B-B of FIG. 5.

As shown above, the feed-in line 42 is able to be located in the same circuit layer with the ground plane 38 and then electrically connected to the feed-in point 36a via a through hole. Referring to FIGS. 5 and 6, they illustrate the feed-in line 42 is disposed in the same circuit layer with the ground plane 38. Therein, the ground plane 38 has an opening 54 and the opening 54 is large enough to accommodate the feed-in line 42, and the feed-in line 42 is electrically connected to the feed-in point 36a of the microstrip radiation device 36 via a through hole 56 so as to transmit the signal of the chip 22 to the microstrip radiation device 36.

This invention is characterized in that there is a microstrip radiation device is formed in a peripheral area of a packaging substrate and the multi circuit layers located in the peripheral area or the area under the peripheral area are employed as feed-in structures to a form package module with anneta formed therein.

Although the invention has been described in considerable detail with reference to certain preferred embodiments, it will be appreciated and understood that various changes and modifications may be made without departing from the spirit and scope of the invention as defined in the appended claims.

What is claimed is:

1. A semiconductor package with a microstrip antenna, comprising:
    a carrier, having an upper surface with a packaging area and a peripheral area surrounding the packaging area, wherein the packaging area has a plurality of contacts formed thereon;
    a chip, attached on the packaging area and electrically connected to the contacts; and
    a microstrip device, disposed on the peripheral area for transceiving a wireless signal of the chip.

2. The semiconductor package of claim 1, further comprising an encapsulation formed on the packaging area and covering the chip and the contacts.

3. The semiconductor package of claim 1, further comprising a plurality of bumps formed on a lower surface of the carrier wherein the bumps are electrically connected to the contacts.

4. The semiconductor package of claim 3, wherein the carrier is a multi-layers substrate and has a plurality of circuit layers formed between the upper surface and the lower surface.

5. The semiconductor package of claim 4, wherein one of the circuit layers has a ground plane therein and located under the microstrip device.

6. The semiconductor package of claim 5, wherein the ground plane has an opening for the wireless signal passing through.

7. The semiconductor package of claim 6, wherein one of the circuit layers has a signal feed-in line located under the ground plane and the signal feed-in line is electrically connected to the chip and coupled to the microstrip device by passing through the opening of the ground plane.

8. The semiconductor package of claim 6, wherein one of the circuit layers has a signal feed-in line located under the ground plane and the signal feed-in line is electrically connected to the chip and electrically connected to the microstrip device by a through hole passing through the opening of the ground plane.

9. The semiconductor package of claim 5, wherein the ground plane has a slot with a signal feed-in line located therein and the signal feed-in line is electrically connected to the chip and electrically connected to the microstrip device by a through hole.

10. A substrate structure having a microstrip antenna, comprising:
    a substrate, having a lower surface and an upper surface with a packaging area and a microstrip disposal area, wherein the packaging area has a plurality of contacts formed thereon; and
    a microstrip device, disposed on the microstrip disposal area for receiving a wireless signal transmitted from the chip.

11. The substrate structure of claim 10, wherein the substrate is a multi-layers substrate and has a plurality of circuit layers formed between the upper surface and the lower surface.

12. The substrate structure of claim 11, wherein one of the circuit layers has a ground plane therein and located under the microstrip device.

13. The substrate structure of claim 12, wherein the ground plane has an opening for the wireless signal passing through.

14. The substrate structure of claim 13, wherein one of the circuit layers has a signal feed-in line located under the ground plane and the signal feed-in line is electrically connected to the chip and coupled to the microstrip device by passing through the opening of the ground plane.

15. The substrate structure of claim 13, wherein one of the circuit layers has a signal feed-in line located under the ground plane and the signal feed-in line is electrically connected to the chip and coupled to the microstrip device by a through hole passing through the opening of the ground plane.

16. The substrate structure of claim 12, wherein the ground plane has a slot with a signal feed-in line located therein and the signal feed-in line is electrically connected to the chip and electrically connected to the microstrip device by a through hole.

* * * * *